United States Patent
Erb et al.

(10) Patent No.: US 6,319,834 B1
(45) Date of Patent: Nov. 20, 2001

(54) METHOD AND APPARATUS FOR IMPROVED PLANARITY METALLIZATION BY ELECTROPLATING AND CMP

(75) Inventors: Darrell M. Erb, Los Altos; Steven C. Avanzino, Cupertino; Fei Wang, San Jose, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/639,812

(22) Filed: Aug. 17, 2000

Related U.S. Application Data
(60) Provisional application No. 60/149,439, filed on Aug. 18, 1999.

(51) Int. Cl.$^7$ .................................................. H01L 21/44
(52) U.S. Cl. ........................... 438/687; 438/692; 438/678
(58) Field of Search .................................. 438/687, 692, 438/678

(56) References Cited

U.S. PATENT DOCUMENTS

| | | |
|---|---|---|
| 5,340,370 | 8/1994 | Cadien et al. . |
| 5,451,551 * | 9/1995 | Krishnan et al. . |
| 5,664,990 | 9/1997 | Adams et al. . |
| 6,130,161 * | 10/2000 | Ashley et al. ........................ 438/687 |
| 6,140,234 * | 10/2000 | Uzoh et al. ........................... 438/678 |
| 6,169,028 * | 1/2001 | Wang et al. ......................... 438/653 |
| 6,176,992 * | 1/2001 | Talieh ..................................... 205/87 |
| 6,218,302 * | 4/2001 | Braeckelmann et al. ............ 438/687 |

\* cited by examiner

Primary Examiner—Jey Tsai

(57) ABSTRACT

A pattern of in-laid conductors is formed by a method utilizing electroplating and chemical-mechanical polishing (CMP). Embodiments include a first step of selectively filling recesses formed in the surface of a substrate with a metal by localized electroplating at a reduced thickness, planar-surfaced overburden or blanket layer thereon, and planarizing the surface by CMP utilizing a relatively soft CMP pad. Embodiments also include an apparatus comprising a porous pad applicator for selectively electroplating recesses formed in the surface of a workpiece.

18 Claims, 3 Drawing Sheets

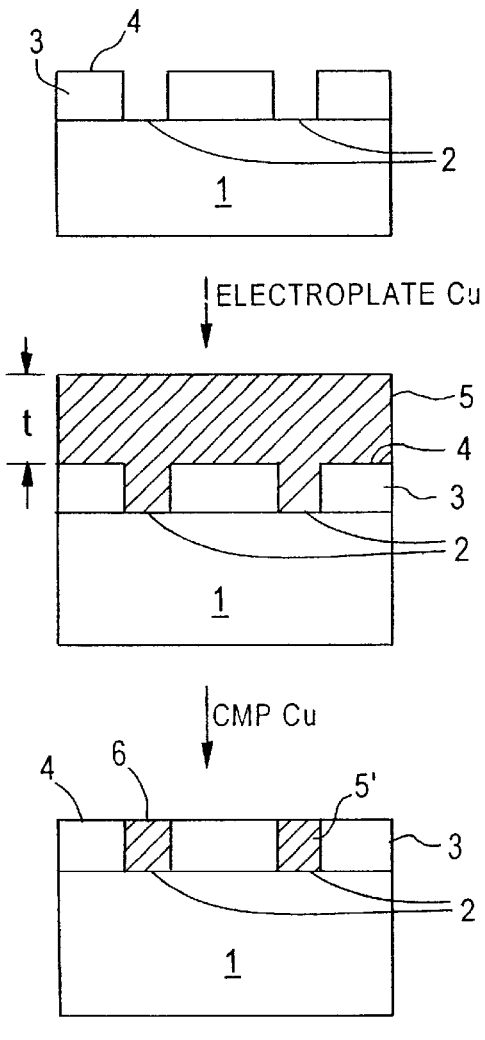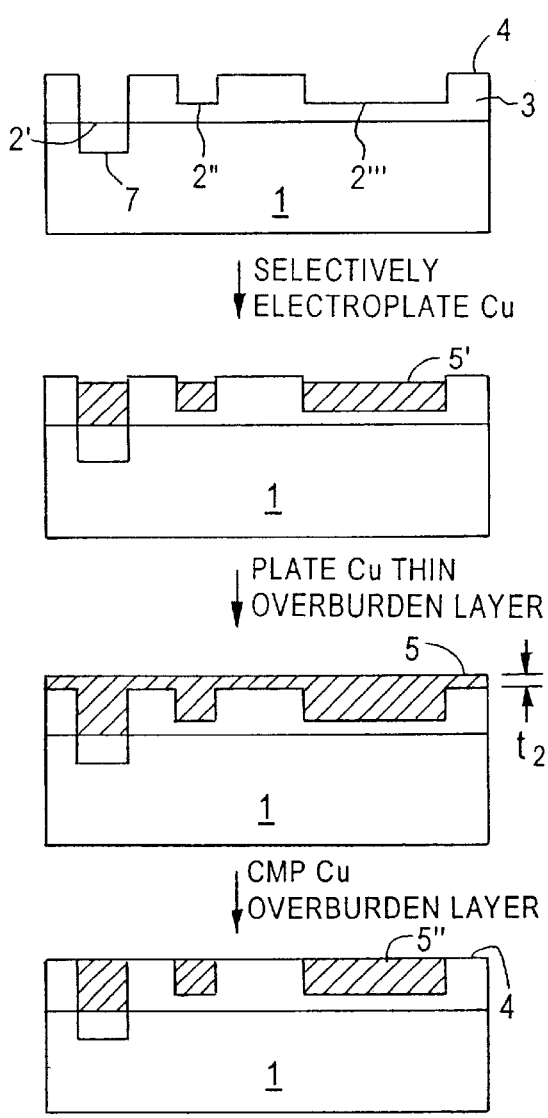

METHOD AND APPARATUS FOR IMPROVED PLANARITY METALLIZATION BY ELECTROPLATING AND CMP

RELATED APPLICATIONS

This application claims priority from Provision Application Ser. No. 60/149,439 filed on Aug. 18, 1999 entitled: "METHOD AND APPARATUS FOR IMPROVED PLANARITY METALLIZATION BY ELECTROPLATING AND CMP", the entire disclosure of which is hereby incorporated by reference therein.

FIELD OF THE INVENTION

The present invention relates to a method and apparatus for forming a layer of electrically conductive material filling a plurality of spaced apart recessed areas of different widths and depths formed in the surface of a substrate, wherein the exposed upper surface of the layer is substantially coplanar with the non-recessed areas of the substrate surface. More particularly, the invention relates to a method for "back-end" metallization of semiconductor integrated circuit devices which facilitates planarization by chemical-mechanical polishing (CMP), increases manufacturing throughput, and improves product quality.

BACKGROUND OF THE INVENTION

This invention relates to a method and apparatus for forming metal films as part of metallization processing of particular utility in integrated circuit semiconductor device and circuit board manufacture, which processing employs "damascene" (or "in-laid") technology.

Metal films of the type contemplated herein are used, e.g., in "back-end" semiconductor manufacturing technology, to form electrically conductive contacts to active as well as passive device regions or components formed in or on a semiconductor substrate, as well as for filling via holes, interlevel metallization, and interconnection routing patterns for wiring together the components and/or regions. Metals employed for such purposes include titanium, tantalum, tungsten, aluminum, chromium, nickel, cobalt, silver, gold, copper, and their alloys. Of these, copper and copper-based alloys are particularly attractive for use in large-scale integration (LSI), very large-scale integration (VLSI), and ultra large scale integration (ULSI) devices requiring multilevel metallization systems for "back-end" processing of the semiconductor wafers on which the devices are based. Copper and copper-based metallization systems have very low resistivities, i.e., even lower than those of previously preferred systems utilizing aluminum and its alloys, as well as significantly higher resistance to electromigration. Moreover, copper and its alloys enjoy a considerable cost advantage over a number of the above-enumerated metals, notably silver and gold. Also, in contrast to aluminum and refractory-type metals, copper and its alloys can be readily deposited in good quality, bright layer form by well known electroplating techniques, at deposition rates fully compatible with the requirements of device manufacturing throughput.

Referring now to FIG. 1, schematically shown therein in cross-sectional view is a conventional damascene processing sequence for forming recessed metallization patterns (i.e., "back-end" contacts, vias, interconnections, routing, etc.) in a semiconductor device formed in or on a semiconductor wafer substrate 1. In a first step, the desired conductor pattern is defined as a pattern of recesses 2 such as grooves, trenches, holes, etc., formed (e.g., by etching) in the surface 4 of a dielectric layer 3 deposited or otherwise formed over the semiconductor substrate, followed by a second step comprising deposition of a suitably conductive metal layer 5 filling the etched recesses 2. Typically, in order to ensure complete filling of the recesses, the metal layer 5 is deposited as a blanket (or "overburden") layer of excess thickness t so as to overfill the recesses 2 and cover the upper surface 4 of the dielectric layer 3. Next, the entire excess thickness t of the metal overburden layer 5 over the surface 4 of the dielectric layer 3 is removed using a chemical-mechanical polishing (CMP) process, leaving metal portions 5' in the recesses 2 with their exposed upper surfaces 6 substantially coplanar with the surface 4 of the dielectric layer 3. Thus this conventional process, termed "damascene process", forms in-laid conductors 5' in the dielectric layer 3 while avoiding problems associated with other types of processes, e.g., metal etching and dielectric gap filling.

While such damascene processing can be performed with a variety of other types of substrates, e.g., printed circuit boards, with and/or without intervening dielectric layers, with a plurality of metallization levels (e.g., five or more levels), and with any of the previously enumerated metals, the parallel drives toward cost reduction and increased microminiaturization of semiconductor devices have provided impetus for greater utilization of copper or copper-based metallization/interconnection metallurgy, particularly in view of the above-described advantages obtainable thereby. However, the use of copper-based metallurgy has presented several problems, including the possibility of copper diffusion into the silicon semiconductor substrate and poor adhesion to various dielectric materials, necessitating provision of an adhesion promoting and/or diffusion barrier layer (e.g., chromium, tantalum, or tantalum nitride) prior to deposition of copper-based metallization.

Another problem associated with damascene processing of copper-based interconnection metallurgy arises from the use of electrolytic deposition of the copper material filling recesses of various geometrical shapes, widths, and depths, and for forming the overburden layer subsequently removed by CMP processing. While electroplating has advantages, such as rapid deposition rates vis-à-vis those obtainable by "dry" processes such as physical or chemical vapor deposition and good compatibility with "wet" CMP processing, electrolytic deposition of copper-based metallization layers suffers from the drawback of ridge build-up and non-planarity at sharp corners of vias, grooves, and trenches.

Referring now to FIG. 2, wherein like reference numerals are used to designate similar features in FIG. 1, in typical practice, a semiconductor wafer substrate 1 will include a variety of recesses 2 of different cross-sectional shapes, widths, and/or depths formed in overlying dielectric layer 3, depending upon the particular metallization feature to be formed. In the illustrated embodiment, recess 2' extends entirely through the thickness of dielectric layer 3 for establishing ohmic contact to active device or component region 7 formed in or on substrate 1, and recesses 2" and 2'" extending to similar depths within the dielectric layer 3 are respectively of narrow and wide widths.

In conventional electroplating processing of structures such as those illustrated in FIG. 2, the wafer is immersed in an electrolyte bath containing copper and subjected to electroplating for simultaneously filing the recesses 2', 2", 2'" and forming a rather thick blanket or overburden layer 5 of copper, of thickness $t_1$ from about 0.5 μm to about 1.5 μm, to ensure complete filling of the deepest resess(es), e.g., recess 2', and for accommodating the different deposition material requirements of the other recesses of various shapes and dimensions, e.g., 2" and 2'". The resulting overburden layer 5 has generally the same thickness $t_1$ in the relatively wide recess(es) 2'" as over the non-recessed portions 4 of the surface. As a consequence, the exposed upper surface of the overburden layer 5 is highly non-planar due to the formation of ridges and valleys, such as shown in 8. In addition, dimples 8' are formed in layer 5 at deep recess(es) 2'.

Removal of such thick, non-planar overburden layers 5 of copper in the subsequent CMP step for planarizing the interconnection metallization pattern entails a number of drawbacks. First, CMP of copper or copper-based alloys is slow and expensive. Specifically, typical copper removal rates by CMP employing a conventional alumina-based slurry are on the order of about 2,000–3,000 Å/min. Consequently, removal of 0.5 –1.5 µm thick copper layers can require long processing times extending up to about 5 minutes, considerably longer than that desired for good manufacturing throughput and reduced expense. Second, because a hard rather than a soft CMP pad is required for polishing of such non-planar copper overburden layers in order to minimize the polish rate of the low areas (e.g., 8 and 8' in FIG. 2), relatively poor uniformity of the polished layer results, accompanied by an increase in defects such as non-planarity ("dishing") and gouging ("erosion") between adjacent metallization lines.

Thus, there exists a need for a method and apparatus for forming in-laid metallization patterns by a damascene technique which does not suffer from the problems and drawbacks of the prior art, i.e., reduced manufacturing throughput, increased cost, poor uniformity, and increased defects such as "dishing" and "gouging". Specifically, there exists a need for an improved electroplating and CMP-based metallization method and apparatus for forming copper-based "back-end" in-laid contacts and interconnection routing of active devices (e.g., transistors) and/or other components in integrated circuit semiconductor devices. Moreover, there exists a need for an improved electroplating and CMP-based method and a apparatus which are fully compatible with conventional process flow and methodology in the manufacture of such integrated circuit semiconductor devices and other devices requiring in-laid metallization patterns.

DISCLOSURE OF THE INVENTION

An advantage of the present invention is a method of manufacturing a device with an in-laid metallization pattern at lower cost and with higher manufacturing throughput than obtainable with conventional process methodology.

Another advantage of the present invention is a method of manufacturing an integrated circuit device utilizing copper-based "back-end" contacts and interconnections by a damascene process, with greater uniformity and plurality and reduced defects.

Still another advantage of the present invention is a method for forming in-laid contacts and metallization patterns by electroplating and CMP at an increased speed, lower cost, and with greater uniformity and planarity than with conventional electroplating and CMP-based processes.

A further advantage of the present invention is an improved method for forming in-laid contacts and metallization patterns by a damascene type electroplating and CMP-based process which is fully compatible with existing process methodology.

A still further advantage of the present invention is an apparatus for selective electroplating of recessed areas formed in the surface of a workpiece.

Additional advantages and other features of the present invention will be set forth in the description which follows and in part will become apparent to those having ordinary skill in the art upon examination of the following or may be learned from the practice of the invention. The advantages of the present invention may be realized and obtained as particularly pointed out in the appended claims.

According to one aspect of the present invention, the foregoing and other advantages are achieved in part by a method of forming a layer of an electrically conductive material filling a plurality of spaced apart recesses of different widths and depths formed in a substrate surface, the layer having an exposed upper surface substantially coplanar with the substrate surface, which method comprises the sequential steps of:

providing a substrate having a surface comprising a plurality of spaced apart recesses of different depths formed therein and a plurality of non-recessed areas therebetween, the plurality of recesses including at least one relatively wide recess and at least one relatively narrow recess;

performing a first plating process for selectively substantially filling the plurality of recesses with the electrically conductive material;

performing a second plating process for forming a predetermined thickness overburden layer of the electrically conductive material over the substrate surface, the exposed upper surface of the overburden layer being generally planar; and chemical-mechanical polishing the exposed upper surface of the overburden layer to (a) substantially remove the portions thereof covering the non-recessed areas of the substrate surface and (b) render the exposed upper surfaces of the portions of the electrically conductive material filling the recesses substantially coplanar with the non-recessed areas of the substrate surface.

In embodiments according to the present invention, the first plating process for selectively substantially filling the recesses comprises selective electroplating by a process comprising providing liquid electrolyte containing an electroplatable component to a porous electrolyte applicator pad, urging the pad against the substrate surface while moving the pad across the surface to selectively supply the plurality of recesses with the liquid electrolyte, and applying an electrical potential to the substrate sufficient to effect deposition of the electroplatable component from the electrolyte in the recesses.

In further embodiments according to the invention, the second plating step comprises a dry process such as a physical or chemical vapor deposition process, or a wet process such as electroplating; the provided substrate comprises a semiconductor wafer having a dielectric layer formed thereon and comprising the surface, and the plurality of recesses of different widths and depths formed in the surface comprise electrical contact areas, vias, interlevel metallization, and/or interconnection routing of at least one active device region or component of the semiconductor wafer.

In embodiments according to the present invention, the layer of electrically conductive material comprises a metal selected from copper, chromium, nickel, cobalt, gold, silver, and alloys thereof, preferably copper and/or alloys thereof, and the substrate is provided with an adhesion promoting and/or diffusion barrier layer and an overlying nucleation layer comprising copper prior to performing the first plating process.

According to another aspect of the present invention, a method of manufacturing a semiconductor device comprises the sequential steps of:

provided a substrate comprising a semiconductor wafer having thereon a dielectric layer with a surface comprising a plurality of spaced apart recesses of different widths and depths formed therein, with non-recessed areas therebetween;

performing a first, selective electroplating process for substantially filling the plurality of recesses with a layer of copper or copper alloy thereof;

performing a second plating process for forming a predetermined thickness overburden layer of copper or copper alloy over the entire substrate surface, the exposed upper surface of the overburden layer being generally planar; and chemical-mechanical polishing the exposed upper surface of the copper or copper alloy overburden layer to (a) substantially remove the portions thereof covering the non-recessed areas of the substrate surface and (b) render the exposed upper surfaces of the copper or copper alloy layer filling the recesses substantially coplanar with the non-recessed areas of the substrate surface.

According to an embodiment of the invention, the selective electroplating process comprises providing liquid electrolyte containing at least electroplatable copper to a porous electrolyte applicator pad, urging the pad against the substrate surface while moving the pad across the surface to selectively supply the plurality of recesses therein with the electrolyte, and applying an electrical potential to the substrate sufficient to effect electrodeposition of copper or an alloy thereof from the electrolyte in the recesses.

According to a further embodiment of the invention, the substrate surface is provided with an adhesion promoting and/or barrier layer comprising chromium, tantalum, or tantalum nitride and an overlying nucleation layer comprising copper or an alloy thereof prior to performing the selective electroplating process.

According to still another aspect of the present invention, an apparatus for selectively electrodepositing a material in at least one recessed area formed in the surface of a substrate comprises:

an electrode adapted for connection to a source of electroplating potential and for mounting thereon a back surface of a workpiece comprising a substrate with an outwardly facing surface having at least one recess formed therein;

an electrolyte applicator comprising a porous pad, the pad adapted for:
(a) receiving therein a supply of liquid electroplating electrolyte;
(b) urging of a surface thereof against the outwardly facing surface of the substrate; and
(c) moving across the outwardly facing surface of the substrate, whereby the electrolyte is selectively supplied to the recesses for electroplating therein.

In an embodiment according to the invention, the porous pad is of a type used in chemical-mechanical polishing (CMP) of metallization patterns formed in or on a surface of a semiconductor substrate.

Additional advantages of the present invention will become readily apparent to those skilled in the art from the following detailed description, wherein only the preferred embodiment of the present invention is shown and described, simply by way of illustration of the best mode contemplated for carrying out the method of the present invention. As will be described, the present invention is capable of other and different embodiments, and its several details are capable of modification in various obvious respects, all without departing from the present invention. Accordingly, the drawing and description are to be regarded as illustrative in nature, and not as limitative.

BRIEF DESCRIPTION OF THE DRAWINGS

The following detailed description of the embodiment of the present invention can best be understood when read in conjunction with the following drawings, wherein:

FIG. 1 illustrates, in simplified cross-sectional schematic form, the sequence of steps for performing a damascene type metallization process according to conventional practices;

FIG. 4 illustrates, in simplified cross-sectional form, the sequence of steps for performing a damascene-type metallization process according to the present invention.

DESCRIPTION OF THE INVENTION

Figure 2:
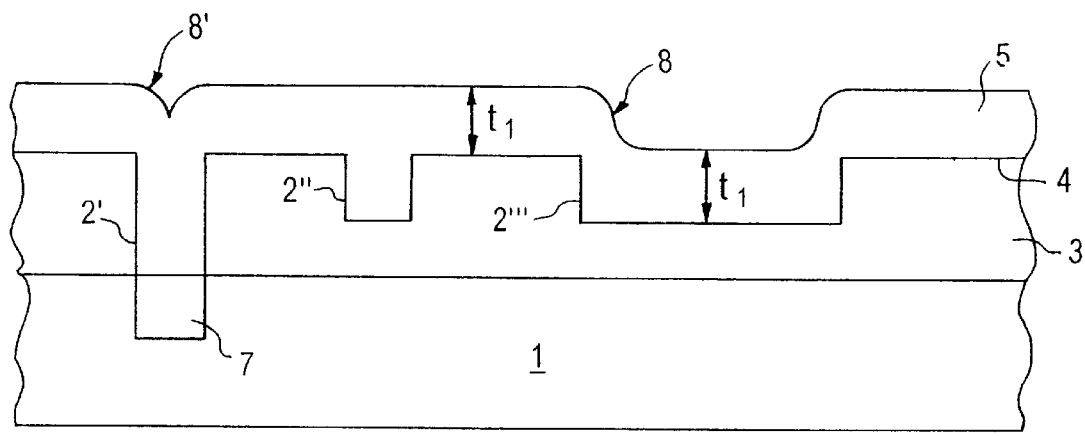
FIG. 2 illustrates, in simplified cross-sectional form, an intermediate structure obtained according to conventional damascene processing employing electroplating.
Figure 3:
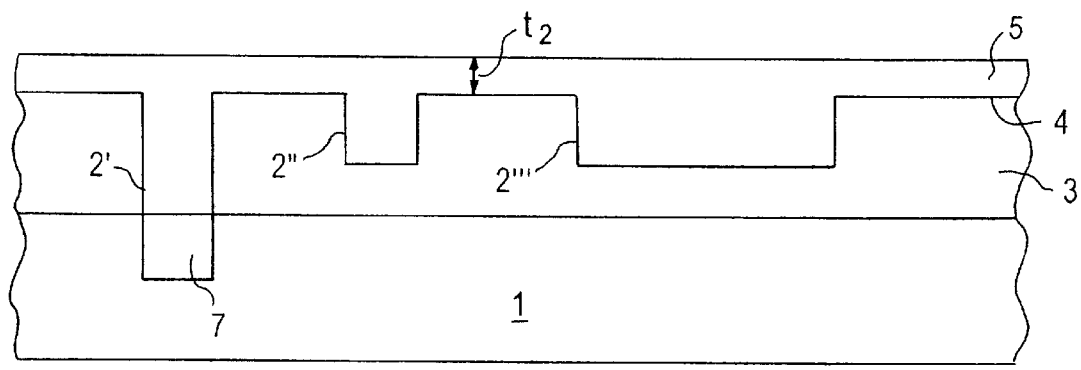
FIG. 3 illustrates, in simplified cross-sectional form, an intermediate structure obtained according to the damascene-type processing method of the present invention.

Referring to FIG. 3, like reference numerals are used to designate features similar to those in FIGS. 1–2 and, hence detailed description thereof will no be given. The present invention is based upon the recognition that formation of an intermediate structure, such as that is shown in the FIG. 3, affords a number of processing advantages. Specifically, the inventive structure includes a copper overburden layer 5 of significantly reduced thickness $t_2$. Reduced thickness of layer 5 can be deposited by conventional electroplating techniques in a shorter time interval and with less consumption of copper plating solution than that required for forming overburden layer 5 of greater thickness $t_1$ (e.g., about 0.5–1.5 $\mu$m) according to conventional processing. In addition, the generally planar exposed upper surface of the overburden layer 5 allows for the advantageous use of soft CMP pads which provide greater uniformity and planarity, as well as reduced defects such as "dishing" and "gouging" associated with the use of hard CMP pads required with thick overburden layers. Finally, the processing time interval is advantageously reduced, relative to conventional damascene processing, due to the significantly reduced thickness of the copper overburden layer to be removed by CMP.

Referring to FIG. 4, like reference numerals are used to designate similar features appearing in previous figures and, hence, will not be described in detail. In FIG. 4 there is shown a sequence of steps for performing a damascene type process according to an embodiment of the present invention, which process utilies an intermediate structure as illustrated in FIG. 3.

In the first step, as in conventional damascene-type metallization processing, a semiconductor wafer workpiece substrate 1 having at least one active device region or component formed therein or thereon is provided, which substrate includes, as before, a variety of recesses 2', 2", 2'" of different cross-sectional geometries, widths, and depths formed in the upper surface of dielectric layer 3. In the second step, a first, selective plating or deposition process is performed to substantially fill the recesses 2', 2", 2'" with an electrically conductive layer 5' while leaving the non-recessed upper surface areas 4 of dielectric layer 3 uncoated. Any of the previously enumerated metals typically employed for "back-end" metallization may be selectively deposited in the recesses; however, copper and its alloys are preferred for the reasons previously set forth. It is noted that complete filling of the recesses is not required by the inventive method, nor are the upper surfaces of the metal filling the recesses required to be exactly coplanar with the non-recessed surface areas 4, as will become evident from the following.

The selective plating or depositing for filling the recesses 2', 2", 2'" may be performed by a variety of methods e.g., from application of a conductive paste with the aid of a doctor blade for removal of excess paste to any well-known photolithographic masking and selective etching technique. However, a particularly preferred mask-less technique which combines simplicity with relatively rapid deposition rates, comprises selective electroplating of the contact/interconnection metal in the recesses.

Figure 5:
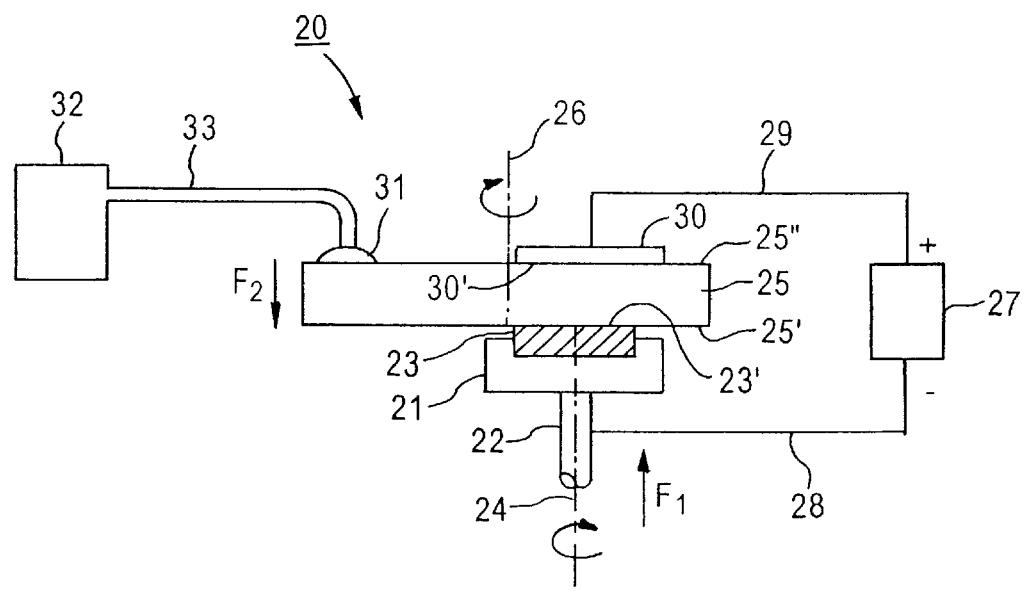
FIG. 5 illustrates, in simplified cross-sectional schematic form, an apparatus according to the present invention for performing selective electroplating of recesses formed in the surface of a workpiece.

Referring now to FIG. 5, shown therein is an apparatus 20 according to an embodiments of the present invention for performing such selective electroplating of recesses formed in the surface of a substrate workpiece. Apparatus 20 resembles known apparatus for performing chemical-mechanical polishing of workpieces substrates such as semiconductor wafers, and comprises, in pertinent part, a workpiece holder 21 connected at its underside to shaft 22 for rotation of a workpiece 23 (e.g., a semiconductor wafer having at least one active device region or component formed in or on the upwardly facing surface 23' thereof) about a central axis 24, while urging the upwardly facing workpiece surface 23' with force $F_1$ against the downwardly facing surface 25' of porous electrolyte applicator pad 25. Electrolyte applicator pad 25 is adapted (by means not shown for illustrative simplicity) for rotating about a central axis 26 in a direction counter to that of workpiece holder 21 while urging downwardly facing surface 25' with force $F_2$ against upwardly facing workpiece surface 23'. Apparatus 20 further includes an electroplating power supply 27, of conventional type, the negative polarity output terminal of which is illustratively shown as operatively connected by line 28 to rotatable shaft 22 for establishing cathodic conditions at workpiece surface 23'. The positive output terminal of power supply 27 is operatively connected by line 29 to electrode 30 located on the upwardly facing surface 25" of applicator pad 25, for establishing anodic conditions at the downwardly facing surface 30' thereof. Anode electrode 30 may be formed of the metal(s) to be electroplated in the recesses of the workpiece, e.g., copper or a copper alloy when plating copper or copper alloy, or may comprise an inert conductive material such as carbon or a noble metal such as platinum, palladium, etc., as is known in the art. A spray of liquid electroplating electrolyte 31 is supplied to the upwardly facing surface 25" of applicator pad 25 from electrolyte reservoir 32 by means of conduit 33, for replenishing consumed electrolyte and maintaining the pores of applicator pad 25 in a filled state.

While in the illustrated embodiment, the electrolyte pad 25—workpiece wafer 23 pair are shown as in mutual counter-rotation, it is necessary only for one member of the pair to move relative to the other. Moreover, any type of motion providing sliding of one opposed surface relative to the other e.g., orbital, elliptical, planetary, etc. may be employed within the ambit of the invention. In addition, while in the disclosed embodiment anode electrode 30 is shown as stationary, it may assume other, e.g., movable configurations, such as an annular ring bonded or otherwise fixed to the upper surface 25" of applicator pad 25 so as to rotate therewith. In such case, electrical connection thereto is made by means of a suitable sliding contact, brush, or slip-ring arrangement.

In operation of apparatus 20, electrolyte 31 supplied from reservoir 32 via conduit 33 to the upwardly facing, rotating surface 25" of applicator pad 25 saturates the pad and fills at least the pores thereof adjacent the downwardly facing surface 25' in pressurized contact with the upwardly facing, recessed-patterned surface 23' of semiconductor wafer workpiece 23. As a result of the counter-rotating motion of the pressurized opposing surfaces, electrolyte 31 squeezed out from the downwardly facing pores of the applicator pad 25 at least partly fills the recesses (e.g., 2', 2", 2'" in FIGS. 2–4) in surface 23' but is effectively precluded from wetting the surfaces of the non-recessed areas (e.g., 4 in FIGS. 2–4) due to the close, tight contact therebetween (see FIG. 6). As a result of the cathodic electrical bias applied to the workpiece surface 23' via power supply 27, and with electrolyte-saturated pad 25 providing a continuous ionic conduction path between cathode 23 and anode 30, electroplatable formed in surface 23', thereby substantially filling same with layer 5' to form the first intermediate structure shown in the second view of FIG. 4.

Figure 6:
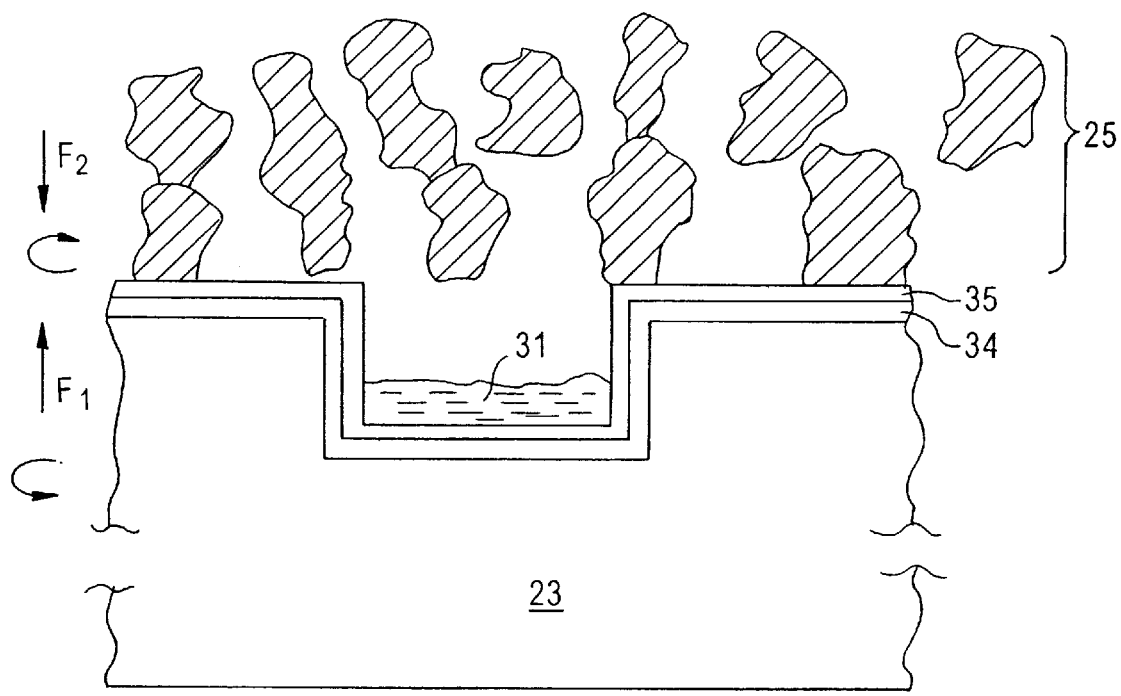
FIG. 6 illustrates, in simplified schematic cross-sectional schematic form, a portion of the apparatus of FIG. 5.

FIG. 6 schematically illustrates, in greater detail, a portion of the surface between the counter-rotating surfaces 23' and 25' of the semiconductor wafer 23 and electrolyte applicator pad 25, respectively. As illustrated, electrolyte applicator pad 25 comprises an open-celled, small pore-sized chemical-mechanical polishing (CMP) type pad. In addition to adequate resiliency/compressibility for minimizing mechanical damage of the workpiece surface due to the pressurized, sliding contact therewith, essential requirements of pad 25 for utility in the above-described process include (1) large contact area with the semiconductor wafer surface and (2) sufficient open area for facilitating electrolyte replenishment.

Also shown in FIG. 6 are adhesion promoting and/or diffusion barrier layer 34 applied to the recess-patterned upwardly facing surface 23' of the semiconductor wafer 23 prior to electroplating thereon and a nucleation layer 35 applied thereover for facilitating electrodeposition. In the case of copper-based metallization, adhesion/barrier layer 34 typically comprises a thin layer of chromium, tantalum, or tantalum nitride, applied in conventional fashion, and overlying metal seed or nucleation layer 35 comprises a very thin layer of copper or copper alloy, also applied in conventional fashion, as by electroplating, electroless plating, or physical or chemical vapor deposition.

Returning to FIG. 4, in the next, i.e., third step according to the inventive method, the first intermediate structure is subjected to a second plating process to form overburden layer 5 of reduced thickness $t_2$ over layer portions 5' substantially filling recesses 2', 2", 2'" and non-recessed surface portions 5. Because the second plating process is performed on a substantially planar-surfaced substrate owing to the selective filling of the recesses in the first plating step, the second plating step results in formation of a second intermediate structure corresponding to the desired, advantageous structure of FIG. 3. As is evident from FIG. 4, overburden layer 5 includes the substantially flat exposed upper surface of FIG. 3, which structure provides the previously enumerated advantages, including reduced deposition time, use of a soft CMP pads resulting in less wafer surface damage, and reduced CMP processing times.

In addition to the above advantages, the inventive method, in which significantly thinner overburden layers are formed, can utilize a variety of deposition methods and techniques for depositing such layers, including, but not limited to, a "dry" process chosen from evaporation, vacuum or electron beam evaporation, plasma or ion beam sputtering, ion plating, chemical vapor deposition, metal-organic vapor deposition, and plasma enhanced chemical vapor deposition; or a "wet" process chosen from electroplating, electroless plating, dipping, spraying, pasting, and printing. Of these, wet processes such as electroplating and electroless plating are advantageous in not requiring switchover from wet to dry processing.

Referring still to FIG. 4, in the last step according to the inventive process, the reduced thickness overburden layer 5, e.g., of copper or copper alloy, is subjected to CMP performed in conventional manner, using a soft pad and an alumina-based slurry to yield a metallization pattern including conductor inlaid features with surfaces 5" coplanar with dielectric layer surfaces 4. Since conventional CMP of copper-based layers has a removal rate of about 2,000–3,000 Å/min., the reduced thickness overburden layer 5 according to the process of the present invention can be removed in a considerably decreased time from that required according to conventional process methodology.

A number of advantages are thus provided by the present invention, including, but not limited to, increased manufacturing throughput and lower material costs than conventional CMP-based damascene type metallization processing of thick blanket layers (e.g., as are obtained with electrodeposition), due to selective filling of the recesses prior to blanket layer deposition; greater planarity of metallization layers due to formation of initially greater planarity blanket layers; and reduced incidence of defects such as "dishing", "gouging", and "erosion" between adjacent metallization routing due to the use of relatively soft CMP pads. In addition, the present invention is advantageously fully compatible with all aspects of conventional CMP process methodology.

In the previous descriptions, numerous specific details are set forth, such as particular materials, structures, reactants, processes, etc., in order to provide a through understanding of the present invention. However, it should be recognized that the present invention can be practiced without resorting to the details specifically set forth. For example, the present invention is applicable to metallizating dual damascene openings as well as single damascene openings, and for circuit board manufacture. In other instances, well-known processing structures and techniques have not been described in detail in order not to unnecessarily obscure the present invention.

Only the preferred embodiments of the present invention are shown and described herein. It is to be understood that the present invention is capable of changes or modifications within the scope of the inventive concept as expressed herein.

What is claimed is:

1. A method of forming a layer of an electrically conductive material filling a plurality of spaced-apart recesses of different widths and depths formed in a substrate surface, said layer having an exposed upper surface substantially co-planar with said substrate surface, which method comprises the sequential steps of:

providing a substrate having an exposed upper surface comprising a plurality of spaced-apart recesses of different depths formed therein and a plurality of non-recessed areas therebetween, said plurality of recesses including at least one relatively wide recess and at least one relatively narrow recess;

performing a first, selective plating process for selectively substantially filing and plurality of recesses with said electrically conductive material while leaving said plurality of non-recessed areas of said upper surface of said substrate unplated;

performing a second plating process for forming a predetermined thickness overburden layer of said electrically conductive material over said upper surface of said substrate, the exposed upper surface of said overburden layer being generally planar; and chemical-mechanical polishing said exposed upper surface of said overburden layer to (a) substantially remove the portions thereof covering said non-recessed areas of said upper surface of said substrate and (b) render the exposed upper surfaces of the portions of said electrically conductive material filling said recesses substantially co-planar with said non-recessed areas of said upper surface of said substrate.

2. The method of claim 1, comprising performing the first plating process for selectively filling the recesses by selectively electroplating said recesses.

3. The method as in claim 2, wherein the selective electroplating process comprises: providing liquid electrolyte containing an electroplatable component to a porous electrolyte applicator pad; urging the pad against the substrate surface while moving the pad across said surface to selectively supply said plurality of recesses with said liquid electrolyte; and applying an electrical potential to said substrate sufficient to effect deposition of said electroplatable component from the electrolyte in the recesses.

4. The method as in claim 3, comprising utilizing a porous applicator pad of a type used for said chemical-mechanical polishing.

5. The method as in claim 3, wherein the second plating step comprises a dry process chosen from evaporation, vacuum or electron beam evaporation, plasma or ion beam sputtering, ion plating, chemical vapor deposition, metal-organic chemical vapor deposition, and plasma enhanced chemical vapor deposition; or a wet process chosen from electroplating, electroless plating, dipping, spraying, pasting, and printing.

6. The method as in claim 5, wherein the second step comprises electroplating.

7. The method as in claim 1, comprising providing a semiconductor wafer substrate having a dielectric layer formed thereon and comprising said surface, and said plurality of recesses of different widths and depths formed in said surface comprise electrical contact areas, vias, interlevel metallization, and/or interconnection routing of at least one active device region or component of said semiconductor wafer.

8. The method as in claim 7, wherein the layer of electrically conductive material comprises a metal selected from the group consisting of copper, chromium, nickel, cobalt, gold, silver, aluminum, tungsten, titanium, tantalum, and alloys thereof.

9. The method as in claim 8, wherein the metal is copper or an alloy thereof.

10. The method as in claim 9, further comprising providing the substrate surface with an adhesion promoting and/or diffusion barrier layer prior to performing said first plating process.

11. The method as in claim 10, comprising providing said adhesion/barrier layer as a layer of chromium, tantalum, or tantalum nitride.

12. The method as in claim 11, further comprising providing the upper, exposed surface of the adhesion/barrier layer with a nucleation layer comprising copper or an alloy thereof prior to performing the first plating process.

13. The method as in claim 12, comprising providing the nucleation layer by electroplating, electroless plating, physical vapor deposition, or chemical vapor deposition.

14. A method of manufacturing a semiconductor device, which method comprises the sequential steps of:

provinding a substrate comprising a semiconductor wafer having thereon a dielectric layer with an exposed upper surface comprising a plurality of spaced-apart recesses of different widths and depths formed therein, with non-recessed areas therebetween;

performing a first, selective electroplating process for selectively substantially filling the plurality of recesses with a layer of copper or an alloy thereof while leaving said non-recessed areas of said upper surface of said substrate unplated;

performing a second plating process for forming a predetermined thickness overburden layer of copper or an alloy thereof over said upper surface of said substrate, the exposed upper surface of said overburden layer being generally planar; and chemical-mechanical polishing said exposed upper surface of said copper or copper alloy overburden layer to (a) substantially remove the portions thereof covering said non-recessed areas of said upper surface of said substrate and render exposed upper surfaces of said copper or copper alloy layer filling said recesses substantially co-planar with said non-recessed areas of said upper surface of said substrate.

15. The method as in claim 14, comprising forming electrical contact areas, vias, interlevel metallization, and/or interconnection routing of at least one active device region or component of said semiconductor wafer substrate.

16. The method as in claim 14, wherein the selective electroplating process comprises providing liquid electrolyte containing at least electroplatable copper to a porous electrolyte applicator pad; urging the pad against the substrate surface while moving the pad across said surface to selectively apply the plurality of recesses therein with the electrolyte; and applying an electrical potential to the substrate sufficient to effect electrodeposition of copper or an alloy thereof from the electrolyte in the recesses.

17. The method as in claim 16, further comprising providing the substrate surface with an adhesion promoting and/or diffusion barrier layer of chromium, tantalum, or tantalum nitride prior to performing the first plating process.

18. The method as in claim 17, further comprising providing the upper, exposed surface of the adhesion/barrier layer with a nucleation layer comprising copper or an alloy thereof prior to performing the first plating process.

* * * * *